US010091402B1

United States Patent
Chung et al.

(10) Patent No.: US 10,091,402 B1
(45) Date of Patent: Oct. 2, 2018

(54) IMAGE CAPTURE APPARATUS

(71) Applicant: Gingy Technology Inc., Hsinchu (TW)

(72) Inventors: Chuck Chung, Hsinchu (TW); Jen-Chieh Wu, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 0 days.

(21) Appl. No.: 15/976,883

(22) Filed: May 11, 2018

Related U.S. Application Data

(63) Continuation-in-part of application No. 15/239,842, filed on Aug. 18, 2016.

(60) Provisional application No. 62/266,002, filed on Dec. 11, 2015.

(30) Foreign Application Priority Data

| Jul. 18, 2016 | (TW) | ................................. 105122567 |
| Aug. 8, 2017 | (TW) | ................................. 106126793 |
| Dec. 5, 2017 | (CN) | ........................ 2017 1 1271306 |

(51) Int. Cl.
| *G02B 27/30* | (2006.01) |
| *H04N 5/225* | (2006.01) |
| *H04N 5/232* | (2006.01) |
| *H04N 5/44* | (2011.01) |

(52) U.S. Cl.
CPC .......... *H04N 5/2253* (2013.01); *G02B 27/30* (2013.01); *H04N 5/2254* (2013.01); *H04N 5/2256* (2013.01); *H04N 5/23216* (2013.01); *H04N 2005/443* (2013.01)

(58) Field of Classification Search
CPC ............ G06K 9/0004; G06K 9/00053; G06K 2209/0006; G09G 3/3225; G02B 27/30; H01L 27/3234
USPC .................................................. 359/641–830
See application file for complete search history.

(56) References Cited

U.S. PATENT DOCUMENTS

| 2016/0132712 A1 | 5/2016 | Yang et al. |
| 2016/0224816 A1 | 8/2016 | Smith et al. |

FOREIGN PATENT DOCUMENTS

CN           205692181        11/2016

*Primary Examiner* — Michael Pervan
(74) *Attorney, Agent, or Firm* — JCIPRNET

(57) ABSTRACT

An image capture apparatus includes a cover plate, a sensor, and an optical collimator disposed between the cover plate and the sensor and including a first, a second, and a third light shielding pattern layers that are overlapped with each other. The first, second, and third light shielding pattern layers have first, second, and third light-transmitting openings, respectively. A size of each third light-transmitting opening is larger than or equal to a size of each second light-transmitting opening, and the size of each second light-transmitting opening is larger than a size of each first light-transmitting opening. Alternatively, the size of each third light-transmitting opening is larger than the size of each second light-transmitting opening, and the size of each second light-transmitting opening is larger than or equal to the size of each first light-transmitting opening.

19 Claims, 4 Drawing Sheets

IMAGE CAPTURE APPARATUS

CROSS-REFERENCE TO RELATED APPLICATION

This application is a continuation-in-part application of and claims the priority benefit of U.S. application Ser. No. 15/239,842, filed on Aug. 18, 2016, now pending, which claims the priority benefits of U.S. provisional application Ser. No. 62/266,002, filed on Dec. 11, 2015, and Taiwan application serial no. 105122567, filed on Jul. 18, 2016. This application also claims the priority benefits of Taiwan application serial no. 106126793, filed on Aug. 8, 2017, and China application serial no. 201711271306.0, filed on Dec. 5, 2017. The entirety of each of the above-mentioned patent applications is hereby incorporated by reference herein and made a part of this specification.

BACKGROUND OF THE INVENTION

Field of the Invention

The disclosure relates to an optoelectronic apparatus, and in particular, to an image capture apparatus.

Description of Related Art

The types of biometric identification include identification of a face, a voice, an iris, a retina, a vein, a palm print, a fingerprint, etc. According to different sensing methods, biometric identification apparatuses are classified into an optical type, a capacitive type, an ultrasonic type, and a thermosensitive type. Generally, an optical-type biometric identification apparatus includes a light source, a light guide element, and a sensor. A light beam emitted by the light source is irradiated to an object to be identified pressed on the light guide element. The sensor receives the light beam reflected by the object to be identified to perform biometric identification. In the process of capturing an image by the sensor, the light beam reflected by the fingerprint is likely to be transmitted to the sensor in a scattered manner, which causes undesirable quality of captured images and affects an identification result. Although improvements have been made to the quality of captured images in the related art, the techniques currently available are likely to overly limit an amount of light entering the sensor while improving crosstalk.

SUMMARY OF THE INVENTION

The exemplary embodiments of the invention provide an image capture apparatus that avoids overly limiting an amount of light entering a sensor while improving crosstalk.

An image capture apparatus according to an exemplary embodiment of the invention includes a cover plate, a sensor, and an optical collimator. The sensor is disposed on one side of the cover plate. The optical collimator is disposed between the cover plate and the sensor. The optical collimator includes a first light shielding pattern layer, a second light shielding pattern layer, and a third light shielding pattern layer that are overlapped with each other. The first light shielding pattern layer includes a plurality of first light-transmitting openings. The second light shielding pattern layer includes a plurality of second light-transmitting openings. The third light shielding pattern layer includes a plurality of third light-transmitting openings. The optical collimator satisfies a condition below: a size of each of the third light-transmitting openings is larger than or equal to a size of each of the second light-transmitting openings, and the size of each of the second light-transmitting openings is larger than a size of each of the first light-transmitting openings; or the size of each of the third light-transmitting openings is larger than the size of each of the second light-transmitting openings, and the size of each of the second light-transmitting openings is larger than or equal to the size of each of the first light-transmitting openings.

In an exemplary embodiment of the invention, the size of each of the third light-transmitting openings is larger than the size of each of the second light-transmitting openings. The size of each of the second light-transmitting openings is larger than the size of each of the first light-transmitting openings. The first light shielding pattern layer, the second light shielding pattern layer, and the third light shielding pattern layer are sequentially arranged from the sensor towards the cover plate or from the cover plate towards the sensor.

In an exemplary embodiment of the invention, the size of each of the third light-transmitting openings is equal to the size of each of the second light-transmitting openings. The size of each of the second light-transmitting openings is larger than the size of each of the first light-transmitting openings. The first light shielding pattern layer, the second light shielding pattern layer, and the third light shielding pattern layer are sequentially arranged from the sensor towards the cover plate or from the cover plate towards the sensor.

In an exemplary embodiment of the invention, the size of each of the third light-transmitting openings is larger than the size of each of the second light-transmitting openings. The size of each of the second light-transmitting openings is equal to the size of each of the first light-transmitting openings. The first light shielding pattern layer, the second light shielding pattern layer, and the third light shielding pattern layer are sequentially arranged from the sensor towards the cover plate or from the cover plate towards the sensor.

In an exemplary embodiment of the invention, the optical collimator further includes a first transparent substrate and a second transparent substrate. The first transparent substrate is located between the sensor and the cover plate. The second transparent substrate is located between the first transparent substrate and the cover plate. The second light shielding pattern layer is located between the first transparent substrate and the second transparent substrate. One of the first light shielding pattern layer and the third light shielding pattern layer is located between the sensor and the first transparent substrate. The other of the first light shielding pattern layer and the third light shielding pattern layer is located between the second transparent substrate and the cover plate.

In an exemplary embodiment of the invention, the image capture apparatus further includes a light source. The light source is located beside the sensor, and the light source and the sensor are located on one side of the cover plate.

In an exemplary embodiment of the invention, the image capture apparatus further includes a display panel. The display panel is located between the optical collimator and the cover plate, and the display panel is a display panel including a touch sensing layer.

In an exemplary embodiment of the invention, the image capture apparatus further includes a band-pass filter layer. The band-pass filter layer is located between the display panel and the sensor.

In an exemplary embodiment of the invention, the optical collimator further includes a fourth light shielding pattern layer. The first light shielding pattern layer, the second light shielding pattern layer, the third light shielding pattern layer, and the fourth light shielding pattern layer are overlapped with each other. The fourth light shielding pattern layer includes a plurality of fourth light-transmitting openings. The optical collimator satisfies condition below: a size of each of the fourth light-transmitting openings is larger than or equal to the size of each of the third light-transmitting openings.

In view of the above, in the image capture apparatus of the exemplary embodiments of the invention, through adjusting the sizes of the light-transmitting openings of the different light shielding pattern layers, the crosstalk as well as a hole blocking phenomenon caused by a process tolerance are both improved, so that the amount of light entering the sensor can be effectively increased. Accordingly, while improving the crosstalk, the image capture apparatus of the exemplary embodiments of the invention also avoids overly limiting the amount of light entering the sensor.

To provide a further understanding of the aforementioned and other features and advantages of the disclosure, exemplary embodiments, together with the reference drawings, are described in detail below.

BRIEF DESCRIPTION OF THE DRAWINGS

The accompanying drawings are included to provide a further understanding of the exemplary embodiments of the invention, and are incorporated in and constitute a part of this specification. The drawings illustrate exemplary embodiments of the invention and, together with the description, serve to explain the principles of the invention.

DESCRIPTION OF THE EXEMPLARY EMBODIMENTS

Figure 1:
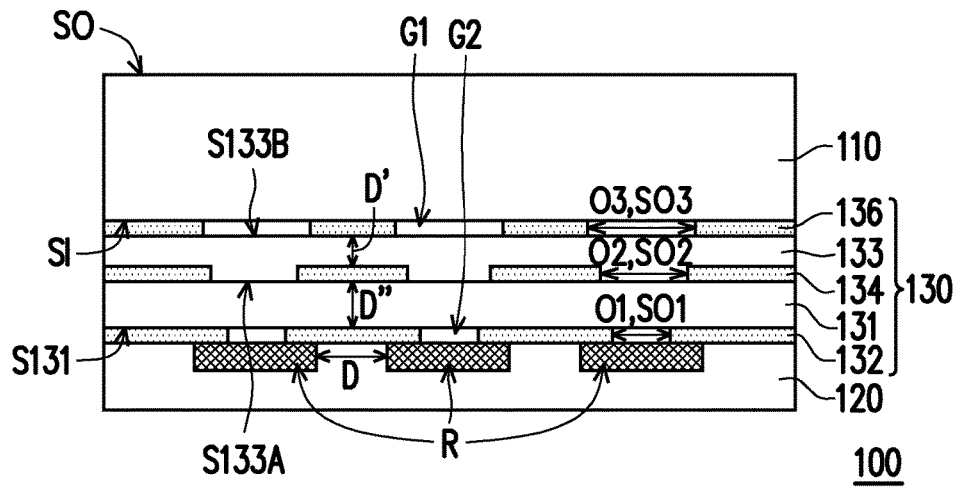
FIG. 1 is a cross-sectional schematic diagram illustrating an image capture apparatus according to a first exemplary embodiment of the invention.

The foregoing and other technical content, features, and effects of the exemplary embodiments of the invention will be clearly presented in the following detailed description of the exemplary embodiments with reference to the reference drawings. Directional terminology, such as "upper", "lower", "front", "back", "left", "right", etc., mentioned in the exemplary embodiments below is used with reference to the orientation of the drawings attached. Accordingly, the directional terminology used will be regarded as illustrating rather than limiting the exemplary embodiments of the invention. Moreover, in the exemplary embodiments below, the same or similar components will be labeled with the same or similar reference numerals.

Figure 2:
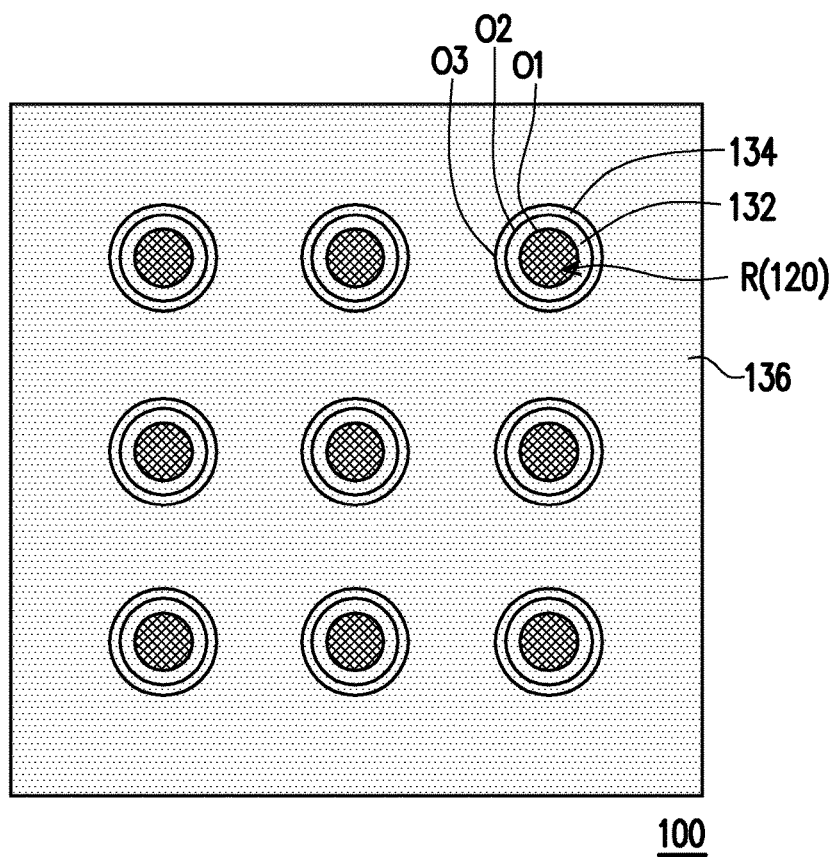
FIG. 2 and FIG. 3 are top schematic diagrams respectively illustrating the image capture apparatus according to the first exemplary embodiment of the invention in a case where a process tolerance is absent and in a case where a process tolerance is present.
Figure 3:
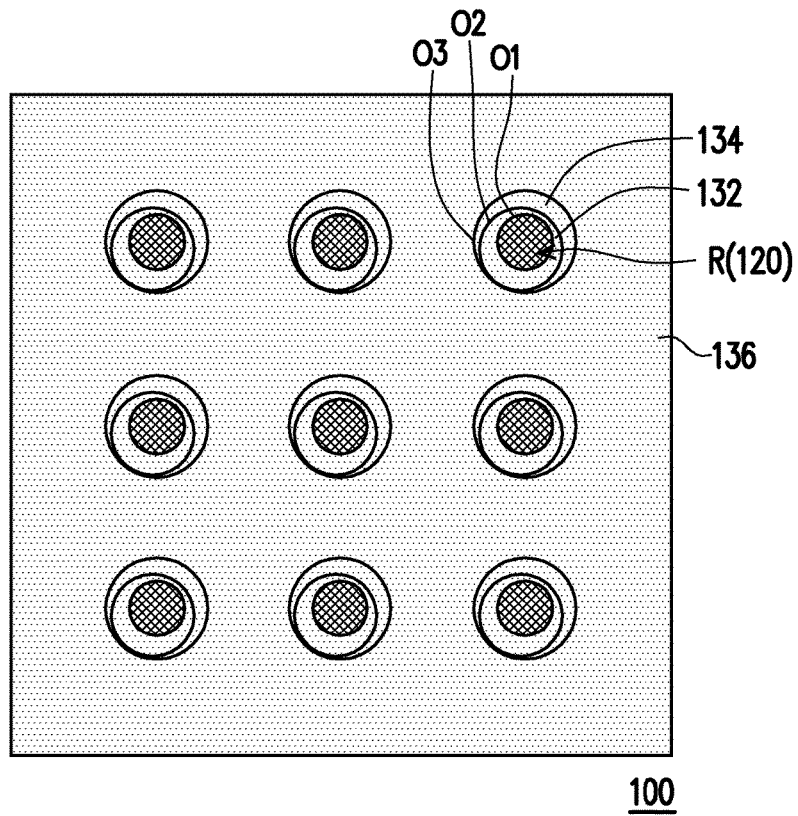

FIG. 1 is a cross-sectional schematic diagram illustrating an image capture apparatus according to a first exemplary embodiment of the invention. FIG. 2 and FIG. 3 are top schematic diagrams respectively illustrating the image capture apparatus according to the first exemplary embodiment of the invention in a case where a process tolerance is absent and in a case where a process tolerance is present.

Referring to FIG. 1 and FIG. 2, an image capture apparatus 100 is adapted to capture a biometric feature of an object under test. For example, the object under test may be a finger or a palm, and the biometric feature may be a fingerprint, a palm print, or a vein, but the invention is not limited hereto.

The image capture apparatus 100 includes a cover plate 110, a sensor 120, and an optical collimator 130.

The cover plate 110 has an outer surface SO and an inner surface SI. The outer surface SO and the inner surface SI are opposite to each other, and the outer surface SO is, for example, a touch operation surface of the image capture apparatus 100, i.e., the object under test touches the outer surface SO of the cover plate 110 for biometric identification.

The cover plate 110 is adapted to protect components located below (e.g., the sensor 120 and the optical collimator 130) and may be a substrate of high mechanical strength to prevent damage to the components below the cover plate 110 due to press of the object under test or impact of other external forces. Moreover, the cover plate 110 is formed of a transparent material, so that a light beam reflected by the object under test (i.e., a light beam carrying information of the fingerprint, the palm print, or the vein) can penetrate through the cover plate 110 and be transmitted towards the sensor 120. For example, the cover plate 110 may be a glass cover plate, such as a glass cover plate of a display apparatus or a glass cover plate of a touch sensing apparatus, but the invention is not limited hereto. In an exemplary embodiment, the cover plate may also be formed by curing a transparent colloid through a heating process or a light irradiation process. The transparent colloid is, for example, an epoxy, a silicone gel, an optical gel, a resin, or another suitable transparent material.

The sensor 120 is disposed on one side of the cover plate 110 and includes a plurality of optical sensing regions R to receive the light beam reflected by the object under test. Specifically, the sensor 120 includes, for example, a charge coupled devices (CCD), a complementary metal-oxide semiconductor (CMOS) device, or another suitable image-sensing device. In the case of the charge coupled device, the plurality of optical sensing regions R are regions where a plurality of charge coupled devices are located. In the case of the complementary metal-oxide semiconductor device, the plurality of optical sensing regions R are a plurality of pixel regions in the complementary metal-oxide semiconductor device.

In an exemplary embodiment, the image capture apparatus 100 further includes a light source (not illustrated). The light source is located beside the sensor 120, and the light source and the sensor 120 are located on one side of the cover plate 110 (e.g., both located below the cover plate 110). The light source is adapted to provide a light beam irradiated to the object under test and may include a plurality of light-emitting elements. The plurality of light emitting elements include, for example, light emitting diodes, laser diodes, or a combination of the two. Moreover, the light beam includes, for example, visible light, non-visible light, or a combination of the two. The non-visible light is, for example, infrared light but is not limited hereto. In a framework where the image capture apparatus 100 includes the light source, a pulse width modulation circuit may be integrally formed in the sensor 120. A light-emitting time of the plurality of light-emitting elements and an image-capturing time of the sensor 120 are controlled by the pulse width modulation circuit, such that the light-emitting time of the plurality of light-emitting elements and the image-capturing time of the sensor 120 are synchronized, and the effect of precise control is achieved, but the invention is not limited hereto.

The optical collimator 130 is disposed between the cover plate 110 and the sensor 120 and is adapted to collimate the light beam that is reflected by the object under test and transmitted towards the sensor 120. Specifically, the optical collimator 130 includes a first light shielding pattern layer 132, a second light shielding pattern layer 134, and a third light shielding pattern layer 136 that are overlapped with each other. The first light shielding pattern layer 132, the second light shielding pattern layer 134, and the third light shielding pattern layer 136 have a high absorption and a low reflectivity to reduce a proportion of the light beam transmitted to the light shielding pattern layers that is reflected by the light shielding pattern layers and a count of reflecting the light beam by the light shielding pattern layers, which further effectively reduces a proportion of large-angle light beams (the angle refers to an angle included between a transmission path of the light beam and a normal line of the optical sensing regions R) that are received by the sensor 120 and thereby improves crosstalk. The low reflectivity means that the reflectivity is lower than 10% in the visible light wave band and the infrared wave band. For example, the light shielding pattern layers are formed of an ink of a low reflectivity but are not limited hereto.

Moreover, to allow the light beam reflected by the object under test to be received by the sensor 120, the first light shielding pattern layer 132, the second light shielding pattern layer 134, and the third light shielding pattern layer 136 respectively include a plurality of first light-transmitting openings O1, a plurality of second light-transmitting openings O2, and a plurality of third light-transmitting openings O3. Each of the first light-transmitting openings O1 is overlapped with one of the second light-transmitting openings O2, one of the third light-transmitting openings O3, and a corresponding optical sensing region R, such that a small-angle light beam transmitted towards the optical sensing region R is transmitted to the corresponding optical sensing region R through the one first light-transmitting opening O1, the one second light-transmitting opening O2, and the one third light-transmitting opening O3 that are overlapped with each other.

The optical collimator 130 satisfies the following condition: a size SO3 of each of the third light-transmitting openings O3 is larger than or equal to a size SO2 of each of the second light-transmitting openings O2, and the size SO2 of each of the second light-transmitting openings O2 is larger than a size SO1 of each of the first light-transmitting openings O1; or the size SO3 of each of the third light-transmitting openings O3 is larger than the size SO2 of each of the second light-transmitting openings O2, and the size SO2 of each of the second light-transmitting openings O2 is larger than or equal to the size SO1 of each of the first light-transmitting openings O1. In a framework where a shape of the light-transmitting openings is circular, the size of the light-transmitting openings refers to a diameter of the light-transmitting openings. In a framework where the shape of the light-transmitting openings is a rectangle, another polygon, or a combination of the foregoing shapes, the size of the light-transmitting openings refers to a width of one of edges of the light-transmitting openings.

In a case where sizes of the plurality of light-transmitting openings of the plurality of light shielding pattern layers are all identical, the larger the sizes of the plurality of light-transmitting openings, the larger an amount of light entering the optical sensing regions R, but crosstalk is likely to occur. Conversely, as the sizes of the plurality of light-transmitting openings become smaller, although crosstalk is effectively improved, the amount of entering light is likely to be overly small. Moreover, it is likely that centers of the plurality of light-transmitting openings of the different light shielding pattern layers cannot be aligned due to a process tolerance. In other words, the light shielding pattern layer closer to the optical sensing regions R may block the light-transmitting openings above it (i.e., a hole blocking phenomenon), which causes an effective opening value (i.e., an intersecting region of the light-transmitting openings of the different light shielding pattern layers) corresponding to each of the optical sensing regions R to be smaller than a predetermined effective opening value (i.e., the sizes of the light-transmitting openings) and thereby causes an actual amount of entering light of each of the optical sensing regions R to be smaller than a predetermined amount of entering light of each of the optical sensing regions R.

Accordingly, In the exemplary embodiment, when designing the sizes of the plurality of light-transmitting openings of the different light shielding pattern layers, the crosstalk, the amount of entering light, and the hole blocking phenomenon caused by the process tolerance are all taken into consideration. For example, the size SO1 of the first light-transmitting openings O1 of the first light shielding pattern layer 132 is designed according to the size of each of the optical sensing regions R, a transverse distance D between two adjacent optical sensing regions R, and a longitudinal distance (including a longitudinal distance D' and a longitudinal distance D") between two adjacent light shielding pattern layers, to improve issues of crosstalk and an overly small amount of entering light at the same time. Moreover, the size of the light-transmitting openings of at least one layer of the other light shielding pattern layers (e.g., at least one of the second light shielding pattern layer 134 and the third light shielding pattern layer 136) is configured to be larger than the size SO1 of the first light-transmitting openings O1 of the first light shielding pattern layer 132. Accordingly, even if the centers of the plurality of light-transmitting openings of the different light shielding pattern layers cannot be aligned due to the process tolerance (see FIG. 3), the light shielding pattern layer closer to the optical sensing regions R is prevented from blocking the light-transmitting openings above it, such that the effective opening value corresponding to each of the optical sensing regions R is equal to or similar to the predetermined effective opening value (i.e., the size SO1 of the first light-transmitting openings O1) and thereby the amount of light entering the sensor 120 is not overly limited while crosstalk is improved.

In the exemplary embodiment, the size SO3 of each of the third light-transmitting openings O3 is larger than the size SO2 of each of the second light-transmitting openings O2, and the size SO2 of each of the second light-transmitting openings O2 is larger than the size SO1 of each of the first light-transmitting openings O1. Moreover, the first light shielding pattern layer 132, the second light shielding pattern layer 134, and the third light shielding pattern layer 136 are sequentially arranged from the sensor 120 towards the cover plate 110. However, relative relations between the sizes of the different light-transmitting openings and arrangement of the different light shielding pattern layers may be changed according to the requirement and are not limited to those illustrated in FIG. 1.

According to different requirements, the optical collimator 100 may further include other components. For example, the optical collimator 100 may further include a first transparent substrate 131 and a second transparent substrate 133 to carry the light shielding pattern layers. The first transparent substrate 131 and the second transparent substrate 133 are adapted to allow the light beam to pass through. For example, the transparent substrates may be glass substrates, plastic substrates, or transparent photoresists but are not limited hereto.

The first transparent substrate 131 is located between the sensor 120 and the cover plate 110, and the second transparent substrate 133 is located between the first transparent substrate 131 and the cover plate 110. The second light shielding pattern layer 134 is located between the first transparent substrate 131 and the second transparent substrate 133. The first light shielding pattern layer 132 is located between the sensor 120 and the first transparent substrate 131. The third light shielding pattern layer 136 is located between the second transparent substrate 133 and the cover plate 110. In the exemplary embodiment, the first light shielding pattern layer 132 is disposed on a surface S131 of the first transparent substrate 131 facing the sensor 120, the second light shielding pattern layer 134 is embedded in a surface S133A of the second transparent substrate 133 facing the first transparent substrate 131, and the third light shielding pattern layer 136 is disposed on a surface S133B of the second transparent substrate 133 facing the cover plate 110, but the invention is not limited hereto. In an exemplary embodiment, the first light shielding pattern layer 132 may be embedded in the surface S131 of the first transparent substrate 131 facing the sensor 120. Moreover, the second light shielding pattern layer 134 may be disposed on the surface S133A of the second transparent substrate 133 facing the first transparent substrate 131. In addition, the third light shielding pattern layer 136 may be embedded in the surface S133B of the second transparent substrate 133 facing the cover plate 110.

An adhesive layer (not illustrated) or a fixing mechanism (not illustrated) may be provided between the cover plate 110 and the second transparent substrate 133, between the second transparent substrate 133 and the first transparent substrate 131, and between the first transparent substrate 131 and the sensor 120 to fix them together. The adhesive layer may be an optical clear adhesive (OCA) or a die attach film (DAF) but is not limited hereto. When the cover plate 110 and the second transparent substrate 133 are fixed together through the adhesive layer, the adhesive layer may be located in a gap G1 between the cover plate 110 and the second transparent substrate 133, between the third light shielding pattern layer 136 and the cover plate 110, or a combination of the two. In other words, a light-transmitting medium in the gap G1 between the cover plate 110 and the second transparent substrate 133 may be air or the adhesive layer. Moreover, when the second transparent substrate 133 and the first transparent substrate 131 are fixed together through the adhesive layer, the adhesive layer may be located between the second transparent substrate 133 and the first transparent substrate 131, between the second light shielding pattern layer 134 and the first transparent substrate 131, or a combination of the two. In addition, when the first transparent substrate 131 and the sensor 120 are fixed together through the adhesive layer, the adhesive layer may be located in a gap G2 between the first transparent substrate 131 and the sensor 120, between the first light shielding pattern layer 132 and the sensor 120, or a combination of the two. In other words, a light-transmitting medium in the gap G2 between the first transparent substrate 131 and the sensor 120 may be air or the adhesive layer.

Next, other exemplary embodiments of the image capture apparatus will be described with reference to FIG. 4 to FIG. 8, wherein the same components are labeled with the same numerals and will not be repeatedly described below. FIG. 4 to FIG. 8 are cross-sectional schematic diagrams respectively illustrating image capture apparatuses according to a second exemplary embodiment to a sixth exemplary embodiment of the invention.

Figure 4:
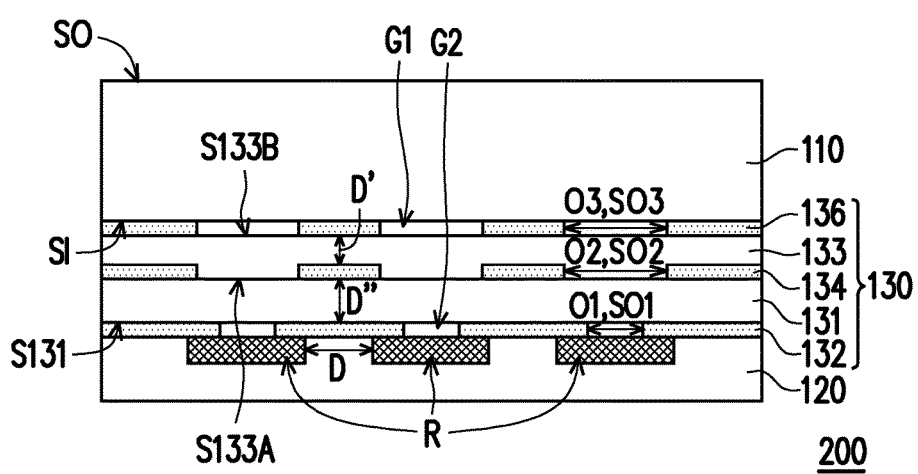
FIG. 4 to FIG. 8 are cross-sectional schematic diagrams respectively illustrating image capture apparatuses according to a second exemplary embodiment to a sixth exemplary embodiment of the invention.

Referring to FIG. 4, the main differences between an image capture apparatus 200 of the second exemplary embodiment of the invention and the image capture apparatus 100 of FIG. 1 are described below. In the image capture apparatus 200, the size SO3 of each of the third light-transmitting openings O3 is equal to the size SO2 of each of the second light-transmitting openings O2, and the size SO2 of each of the second light-transmitting openings O2 is larger than the size SO1 of each of the first light-transmitting openings O1. In the exemplary embodiment, the first light shielding pattern layer 132, the second light shielding pattern layer 134, and the third light shielding pattern layer 136 are sequentially arranged from the sensor 120 towards the cover plate 110, but the invention is not limited hereto. In another exemplary embodiment, the first light shielding pattern layer 132, the second light shielding pattern layer 134, and the third light shielding pattern layer 136 are sequentially arranged from the cover plate 110 towards the sensor 120, such that the third light shielding pattern layer 136 is located between the sensor 120 and the first transparent substrate 131, and the first light shielding pattern layer 132 is located between the second transparent substrate 133 and the cover plate 110.

Figure 5:
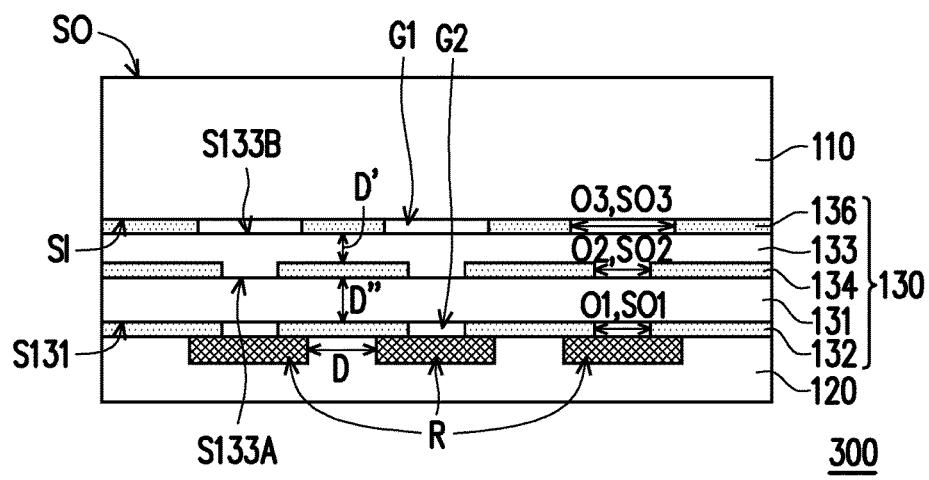

Referring to FIG. 5, the main differences between an image capture apparatus 300 of the third exemplary embodiment of the invention and the image capture apparatus 100 of FIG. 1 are described below. In the image capture apparatus 300, the size SO3 of each of the third light-transmitting openings O3 is larger than the size SO2 of each of the second light-transmitting openings O2, and the size SO2 of each of the second light-transmitting openings O2 is equal to the size SO1 of each of the first light-transmitting openings O1. In the exemplary embodiment, the first light shielding pattern layer 132, the second light shielding pattern layer 134, and the third light shielding pattern layer 136 are sequentially arranged from the sensor 120 towards the cover plate 110, but the invention is not limited hereto. In another exemplary embodiment, the first light shielding pattern layer 132, the second light shielding pattern layer 134, and the third light shielding pattern layer 136 are sequentially arranged from the cover plate 110 towards the sensor 120, such that the third light shielding pattern layer 136 is located between the sensor 120 and the first transparent substrate 131, and the first light shielding pattern layer 132 is located between the second transparent substrate 133 and the cover plate 110.

Figure 6:
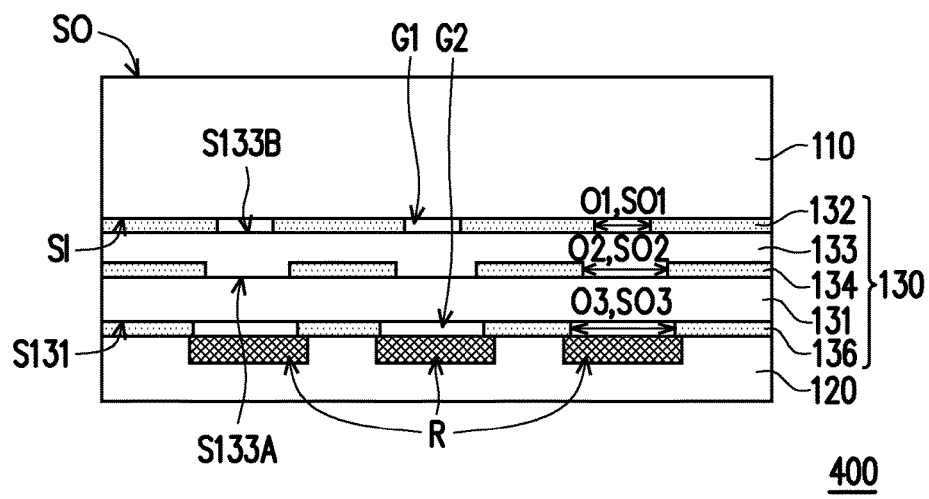

Referring to FIG. 6, the main differences between an image capture apparatus 400 of the fourth exemplary embodiment of the invention and the image capture apparatus 100 of FIG. 1 are described below. In the image capture apparatus 100 of FIG. 1, the sizes of the plurality of light-transmitting openings of the different light shielding pattern layers are incrementally increased from the sensor 120 towards the cover plate 110. In contrast, in the image capture apparatus 400 of FIG. 6, the sizes of the plurality of light-transmitting openings of the different light shielding pattern layers are incrementally decreased from the sensor 120 towards the cover plate 110.

Specifically, the first light shielding pattern layer 132, the second light shielding pattern layer 134, and the third light shielding pattern layer 136 are sequentially arranged from the cover plate 110 towards the sensor 120, such that the third light shielding pattern layer 136 is located between the sensor 120 and the first transparent substrate 131, and the first light shielding pattern layer 132 is located between the second transparent substrate 133 and the cover plate 110. In the exemplary embodiment, the third light shielding pattern layer 136 is disposed on the surface S131 of the first transparent substrate 131 facing the sensor 120, and the first light shielding pattern layer 132 is disposed on the surface S133B of the second transparent substrate 133 facing the cover plate 110, but the invention is not limited hereto. In an exemplary embodiment, the third light shielding pattern layer 136 may be embedded in the surface S131 of the first transparent substrate 131 facing the sensor 120, and the first light shielding pattern layer 132 may be embedded in the surface S133B of the second transparent substrate 133 facing the cover plate 110.

Figure 7:
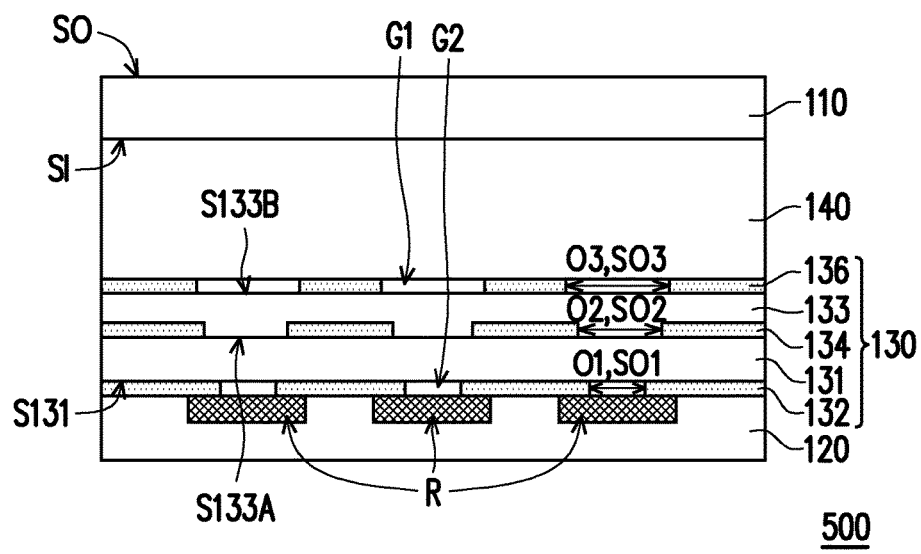

Referring to FIG. 7, the main differences between an image capture apparatus 500 of the fifth exemplary embodiment of the invention and the image capture apparatus 100 of FIG. 1 are described below. In the image capture apparatus 500, the image capture apparatus 500 further includes a display panel 140 to provide a display function. The display panel 140 is located between the optical collimator 130 and the cover plate 110. For example, the display panel 140 may be a thin film transistor liquid crystal display panel (TFT-LCD panel), a micro light emitting diode display panel (micro LED display panel), an organic light emitting diode display panel (OLED display panel), or a display panel including a touch sensing layer (i.e., an electrode wiring), but is not limited hereto. When the display panel 140 is a self-luminous display panel, a portion of a light beam provided by the display panel 140 may be used in biometric identification, but the invention is not limited hereto.

Figure 8:
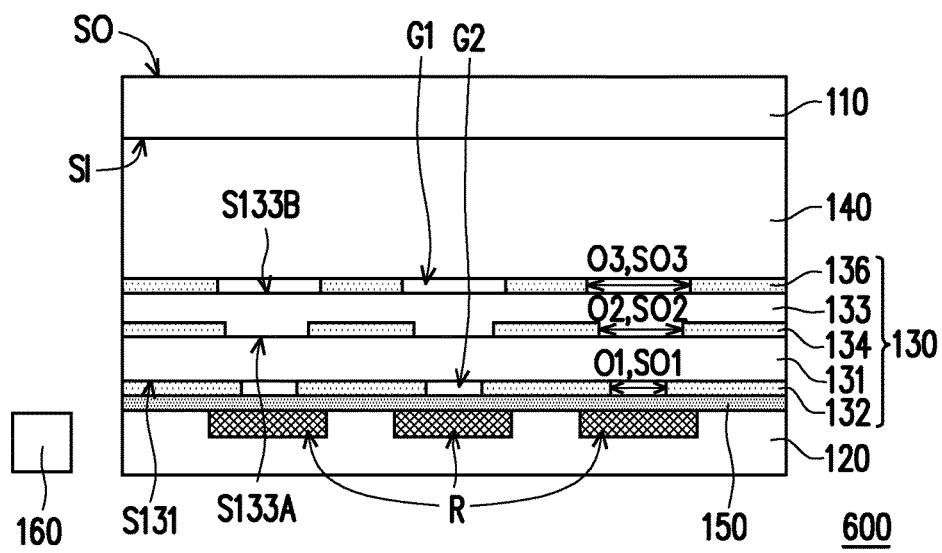

Referring to FIG. 8, the main differences between an image capture apparatus 600 of the sixth exemplary embodiment of the invention and the image capture apparatus 500 of FIG. 7 are described below. In the image capture apparatus 600, the image capture apparatus 600 further includes a band-pass filter layer 150 and a light source 160. The band-pass filter layer 150 is located between the display panel 140 and the sensor 120, the light source 160 is located beside the sensor 120, and the light source 160 and the sensor 120 are located on one side of the cover plate 110 (e.g., both located below the cover plate 110).

In the exemplary embodiment, the band-pass filter layer 150 is located between the optical collimator 130 and the sensor 120, and the light source 160 is located on one side of the sensor 120, but the invention is not limited hereto. In an exemplary embodiment, the band-pass filter layer 150 may be located between the display panel 140 and the optical collimator 130. Moreover, the light source 160 may be located on multiple sides of the sensor 120 (e.g., disposed on multiple edges of the sensor 120, multiple corners of the sensor 120, or combination of the two).

The light source 160 is adapted to provide a light beam for biometric identification. The band-pass filter layer 150 is adapted to allow the light beam from the light source 160 to pass through (namely, a light-emitting spectrum of the light source 160 falls in a transmissive spectrum of the band-pass filter layer 150) and filter other light beams to avoid interference resulting from environmental light beams or the light beam from the display panel 140 that is transmitted to the sensor 120 and thereby enhance an identification capacity of the image capture apparatus 600. For example, the band-pass filter layer 150 may be an infrared band-pass filter layer that allows a light beam having a wavelength of 800 nm to 900 nm to pass through and filters light beams having wavelengths out of the range of 800 nm to 900 nm. Correspondingly, the light source 120 is, for example, an infrared light source having a wavelength falling in the range of 800 nm to 900 nm. In other exemplary embodiments, the band-pass filter layer 150 may be a band-pass filter layer that allows a light beam having a wavelength of 840 nm to 860 nm or a light beam having a wavelength of 890 nm to 990 nm to pass through, and the light source 120 may be an infrared light source having a wavelength falling in the range of 840 nm to 860 nm or in the range of 890 nm to 990 nm, but the invention is not limited hereto.

Although the optical collimator 130 in the first exemplary embodiment to the sixth exemplary embodiment invariably includes only three light shielding pattern layers, the number of the light shielding pattern layers in the optical collimator 130 is not limited hereto. In an exemplary embodiment, the optical collimator may further include a fourth light shielding pattern layer (not illustrated). The first light shielding pattern layer, the second light shielding pattern layer, the third light shielding pattern layer, and the fourth light shielding pattern layer are overlapped with each other, and the fourth light shielding pattern layer includes a plurality of fourth light-transmitting openings. The optical collimator satisfies the following condition: a size of each of the fourth light-transmitting openings is larger than or equal to the size of each of the third light-transmitting openings. Moreover, the first light shielding pattern layer, the second light shielding pattern layer, the third light shielding pattern layer, and the fourth light shielding pattern layer may be sequentially arranged from the sensor towards the cover plate or from the cover plate towards the sensor. In still another exemplary embodiment, the optical collimator may include more than four light shielding pattern layers (not illustrated), wherein a size of each of fifth light-transmitting openings is larger than or equal to the size of each of the fourth light-transmitting openings, and sizes of light-transmitting openings of the rest of the light shielding pattern layers may be analogously inferred in the same manner and are not repeatedly described here.

In summary of the above, in the image capture apparatus of the exemplary embodiments of the invention, through adjusting the sizes of the light-transmitting openings of the different light shielding pattern layers, the crosstalk as well as the hole blocking phenomenon caused by the process tolerance are both improved, so that the amount of light entering the sensor can be effectively increased. Accordingly, while improving the crosstalk, the image capture apparatus of the exemplary embodiments of the invention also avoids overly limiting the amount of light entering the sensor.

Although the invention is disclosed as the exemplary embodiments above, the exemplary embodiments are not meant to limit the invention. Any person skilled in the art may make slight modifications and variations without departing from the spirit and scope of the invention. Therefore, the protection scope of the invention shall be defined by the claims attached below.

What is claimed is:

1. An image capture apparatus, comprising:
   a cover plate;
   a sensor, disposed on one side of the cover plate; and an optical collimator, disposed between the cover plate and the sensor, wherein the optical collimator comprises a first light shielding pattern layer, a second light shielding pattern layer, and a third light shielding pattern layer, the first light shielding pattern layer, the second light shielding pattern layer, and the third light shielding pattern layer are overlapped with each other, the first light shielding pattern layer comprises a plurality of first light-transmitting openings, the second light shielding pattern layer comprises a plurality of second light-transmitting openings, the third light shielding pattern layer comprises a plurality of third light-transmitting openings, and the optical collimator satisfies a condition below:

a size of each of the third light-transmitting openings is larger than or equal to a size of each of the second light-transmitting openings, and the size of each of the second light-transmitting openings is larger than a size of each of the first light-transmitting openings; or the size of each of the third light-transmitting openings is larger than the size of each of the second light-transmitting openings, and the size of each of the second light-transmitting openings is larger than or equal to the size of each of the first light-transmitting openings.

2. The image capture apparatus according to claim 1, wherein the size of each of the third light-transmitting openings is larger than the size of each of the second light-transmitting openings, the size of each of the second light-transmitting openings is larger than the size of each of the first light-transmitting openings, and the first light shielding pattern layer, the second light shielding pattern layer, and the third light shielding pattern layer are sequentially arranged from the sensor towards the cover plate or from the cover plate towards the sensor.

3. The image capture apparatus according to claim 1, wherein the size of each of the third light-transmitting openings is equal to the size of each of the second light-transmitting openings, the size of each of the second light-transmitting openings is larger than the size of each of the first light-transmitting openings, and the first light shielding pattern layer, the second light shielding pattern layer, and the third light shielding pattern layer are sequentially arranged from the sensor towards the cover plate or from the cover plate towards the sensor.

4. The image capture apparatus according to claim 1, wherein the size of each of the third light-transmitting openings is larger than the size of each of the second light-transmitting openings, the size of each of the second light-transmitting openings is equal to the size of each of the first light-transmitting openings, and the first light shielding pattern layer, the second light shielding pattern layer, and the third light shielding pattern layer are sequentially arranged from the sensor towards the cover plate or from the cover plate towards the sensor.

5. The image capture apparatus according to claim 1, wherein the optical collimator further comprises a first transparent substrate and a second transparent substrate, the first transparent substrate is located between the sensor and the cover plate, the second transparent substrate is located between the first transparent substrate and the cover plate, the second light shielding pattern layer is located between the first transparent substrate and the second transparent substrate, one of the first light shielding pattern layer and the third light shielding pattern layer is located between the sensor and the first transparent substrate, and the other of the first light shielding pattern layer and the third light shielding pattern layer is located between the second transparent substrate and the cover plate.

6. The image capture apparatus according to claim 2, wherein the optical collimator further comprises a first transparent substrate and a second transparent substrate, the first transparent substrate is located between the sensor and the cover plate, the second transparent substrate is located between the first transparent substrate and the cover plate, the second light shielding pattern layer is located between the first transparent substrate and the second transparent substrate, one of the first light shielding pattern layer and the third light shielding pattern layer is located between the sensor and the first transparent substrate, and the other of the first light shielding pattern layer and the third light shielding pattern layer is located between the second transparent substrate and the cover plate.

7. The image capture apparatus according to claim 3, wherein the optical collimator further comprises a first transparent substrate and a second transparent substrate, the first transparent substrate is located between the sensor and the cover plate, the second transparent substrate is located between the first transparent substrate and the cover plate, the second light shielding pattern layer is located between the first transparent substrate and the second transparent substrate, one of the first light shielding pattern layer and the third light shielding pattern layer is located between the sensor and the first transparent substrate, and the other of the first light shielding pattern layer and the third light shielding pattern layer is located between the second transparent substrate and the cover plate.

8. The image capture apparatus according to claim 4, wherein the optical collimator further comprises a first transparent substrate and a second transparent substrate, the first transparent substrate is located between the sensor and the cover plate, the second transparent substrate is located between the first transparent substrate and the cover plate, the second light shielding pattern layer is located between the first transparent substrate and the second transparent substrate, one of the first light shielding pattern layer and the third light shielding pattern layer is located between the sensor and the first transparent substrate, and the other of the first light shielding pattern layer and the third light shielding pattern layer is located between the second transparent substrate and the cover plate.

9. The image capture apparatus according to claim 1, further comprising:
a light source, located beside the sensor, wherein the light source and the sensor are located on one side of the cover plate.

10. The image capture apparatus according to claim 2, further comprising:
a light source, located beside the sensor, wherein the light source and the sensor are located on one side of the cover plate.

11. The image capture apparatus according to claim 3, further comprising:
a light source, located beside the sensor, wherein the light source and the sensor are located on one side of the cover plate.

12. The image capture apparatus according to claim 4, further comprising:
a light source, located beside the sensor, wherein the light source and the sensor are located on one side of the cover plate.

13. The image capture apparatus according to claim 1, further comprising:

a display panel, located between the optical collimator and the cover plate.

14. The image capture apparatus according to claim 2, further comprising:
a display panel, located between the optical collimator and the cover plate.

15. The image capture apparatus according to claim 3, further comprising:
a display panel, located between the optical collimator and the cover plate.

16. The image capture apparatus according to claim 4, further comprising:
a display panel, located between the optical collimator and the cover plate.

17. The image capture apparatus according to claim 13, further comprising:
a band-pass filter layer, located between the display panel and the sensor.

18. The image capture apparatus according to claim 1, wherein the optical collimator further comprises a fourth light shielding pattern layer, the first light shielding pattern layer, the second light shielding pattern layer, the third light shielding pattern layer, and the fourth light shielding pattern layer are overlapped with each other, the fourth light shielding pattern layer comprises a plurality of fourth light-transmitting openings, and the optical collimator satisfies a condition below:
a size of each of the fourth light-transmitting openings is larger than or equal to the size of each of the third light-transmitting openings.

19. The image capture apparatus according to claim 13, wherein the display panel is a display panel comprising a touch sensing layer.

* * * * *